United States Patent
Frey et al.

(10) Patent No.: US 6,960,536 B2
(45) Date of Patent: Nov. 1, 2005

(54) METHOD FOR PRODUCING INTEGRATED MICROSYSTEMS

(75) Inventors: Wilhelm Frey, Palo Alto, CA (US); Franz Laermer, Weil Der Stadt (DE); Christoph Duenn, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 16 days.

(21) Appl. No.: 10/613,459

(22) Filed: Jul. 3, 2003

(65) Prior Publication Data

US 2004/0127008 A1 Jul. 1, 2004

(30) Foreign Application Priority Data

Jul. 4, 2002 (DE) .......................................... 102 30 252

(51) Int. Cl.[7] ............................................. H01L 21/461

(52) U.S. Cl. ......................... 438/752; 438/745; 438/689

(58) Field of Search ................................ 438/689, 745, 438/602

(56) References Cited

U.S. PATENT DOCUMENTS

| | | | |
|---|---|---|---|
| 6,210,988 B1 | 4/2001 | Howe et al. | |
| 6,261,964 B1 * | 7/2001 | Wu et al. | .................... 438/705 |

FOREIGN PATENT DOCUMENTS

| | | |
|---|---|---|
| DE | 38 74 411 | 10/1992 |
| EP | 0 292 057 | 11/1988 |

OTHER PUBLICATIONS

Franke et al., "Post–CMOS Mudular Integration Of Poly–SiGe Microstructures Uing Poly–Ge Sacrificial Layers", Solid–State Sensor and Actualor Workshop, Hilton Head, SC Jun. 2000, pp. 18–21.*

Franke et al., "Post–CMOS Modular Integration of Poly–SiGe Microstructures Using Poly–Ge Sacraficial Layers", Solid–State Sensor and Actuator Workshop, Hilton Head, SC, Jun. 2000, pp. 18–21.

* cited by examiner

Primary Examiner—Thao P. Le
(74) Attorney, Agent, or Firm—Kenyon & Kenyon

(57) ABSTRACT

A method for producing a microsystem that has, situated on a substrate, a first functional layer that includes a conductive area and a sublayer. Situated on the first functional layer is a second mechanical functional layer, which is first initially applied onto a sacrificial layer situated and structured on the first functional layer. In addition, a layer is situated on the side of the sublayer facing away from the conductive area. The layer constitutes a protective layer on the first functional layer that acts in areas during a sacrificial layer etching process so that during removal of the sacrificial layer no etching of the areas of the first functional layer covered by the protective layer occurs, and that in the region of the areas of the first functional layer implemented without the protective layer the sublayer is removed essentially selectively to the conductive area at the same time as the sacrificial layer. Further, a method is described for producing integrated microsystems having silicon-germanium functional layers, sacrificial layers containing germanium, and open metal surfaces. The sacrificial layers containing germanium are at least partially removed in an etching solution, a pH value of the etching solution being kept at least approximately neutral during the etching procedure using a buffer.

12 Claims, 4 Drawing Sheets

METHOD FOR PRODUCING INTEGRATED MICROSYSTEMS

FIELD OF THE INVENTION

The present invention relates to a method for producing integrated Microsystems, and to a method for producing a microsystem.

BACKGROUND INFORMATION

An integrated microsystem may be produced using silicon-germanium compounds and germanium, as referred to in Franke, A. E., Jiao, Y., Wu, T., King, T.-J., and Howe, R. T., Post-CMOS modular integration of poly-SiGe microstructures using poly-Ge sacrificial layers, Solid-State Sensor and Actuator Workshop, Hilton Head, S. C., June 2000, pp. 18–21, and in U.S. Pat. No. 6,210,988.

Integrated Microsystems are electronic systems or a combination of electronic and mechanical systems, such as for example resonators, accelerometers or rotational speed sensors.

To produce them, a conductor layer of silicon-germanium or aluminum is first applied and structured on a wafer having electronic circuits, through electronic passivation. There is a diffusion barrier on the aluminum, of titanium nitride (TiN) for example, to prevent diffusion between the aluminum conductor layer and a SiGe layer. Without this barrier, aluminum atoms would diffuse into the SiGe layer and in some circumstances, would change the material properties of the SiGe layer so that its favorable structuring properties and its good mechanical properties are degraded.

To accomplish the structuring, a layer of photoresist is applied to the layer of silicon-germanium or aluminum-(TiN), and is then exposed. The exposure defines the places where the previously applied photoresist will remain, the exposure phase being followed by a development phase. Next the wafer, i.e., the layer of silicon-germanium or aluminum-(TiN), is etched in an etching procedure, the non-masked parts, i.e., the parts not passivated with the exposed and developed resist, being stripped away during the etching process.

On the silicon-germanium or aluminum layer, which constitutes for example a connection between electronic and mechanical components of a microsystem, a sacrificial layer made up for example of germanium or germanium-rich silicon-germanium is usually deposited and structured, the proportion of germanium in the latter material, which may be 80%.

On top of this sacrificial layer the actual functional layer of SiGe is applied and structured. Before the SiGe functional layer is applied, the sacrificial layer may be structured, for example using a reactive plasma. The SiGe functional layer has a smaller proportion of germanium than the sacrificial layer; a germanium proportion of the SiGe functional layer smaller than 80% may be provided, for example. Over a germanium-rich SiGe sacrificial layer or a germanium sacrificial layer, a SiGe functional layer having a smaller proportion of germanium is thus provided, which is structured into the geometry of the sensor elements using available RIE methods.

After the application of this SiGe functional layer, the sacrificial layer is at least partially removed using an oxidizing agent, there typically being areas located under the sacrificial layer having passivation of electronic circuits as well as open bonding pads and vias, possibly even open conductors, made up as a rule of aluminum, aluminum-silicon or aluminum-silicon-copper. During the sacrificial layer etching these metallic regions are exposed, so that the metallic regions come into direct contact with the etching solution and thus are able to interact with it.

Hydrogen peroxide may be used for example as the etching solution, as referred to in German Patent 38 74 411. It does not attack the electronic passivation, so that no special precautions are necessary to protect the passivation.

A disadvantage of this method, however, may be that while the sacrificial layers are being etched, a reaction occurs between the etching solution, for example hydrogen peroxide, and any open conductors and bonding contacts of aluminum or aluminum alloys, which in some cases even results in complete destruction of bonding pads and other open metallic areas before the sacrificial layer to be stripped is completely removed. The damage to or destruction of the bonding pads or conductors may be comparable in certain circumstances to destruction of the entire integrated microsystem. The etching attack results from the fact that during dissolution of the Ge sacrificial layer or SiGe sacrificial layer, acidic reaction products are formed which lower the pH value of the $H_2O_2$ solution so greatly and shift it so far into the acidic range that the aforementioned metallic structures are also attacked. An approximately neutral $H_2O_2$ solution does not result in the unwanted etching attack on the metallic structures.

To prevent such an attack on or such destruction of the bonding pads or conductors of a microsystem, in practice an attempt is made to provide the bonding pads or conductors with passivating layers. However, this may necessitate additional process steps, which lead to an increase in the manufacturing costs.

SUMMARY OF THE INVENTION

Using the exemplary method described herein for the production of integrated Microsystems, whereby a pH value of the etching solution is kept at least approximately neutral using a buffer during the process of etching a sacrificial layer, may advantageously achieve the result that open metal surfaces or conductors of the microsystem are not attacked and destroyed by the etching solution. Especially when using open conductors of aluminum compounds, which exhibit amphoteric behavior and are therefore attacked by both bases and acids, this may advantageously prevent destruction of such conductors by etching solutions whose pH value is in the neutral range and is kept there in spite of acidic reaction products such as $H_2Ge(OH)_6$.

In addition, the exemplary method according to the present invention should guarantee or at least better ensure that etching products that arise during the etching process, which would shift a pH value of the etching solution into acidic ranges, are caught by the buffer, and that the pH value of the etching solution is stabilized around pH 7 during the entire etching process.

Using the exemplary method according to the present invention in particular makes precautions superfluous that offer protection of open metal layers of a microsystem which are not covered by passivation layers, for example by applying protective layers before a process of etching sacrificial layers, so that production of such Microsystems is simplified.

Using the exemplary method according to the present invention having the features of claim 11 for the production of a microsystem, whereby a protective layer is applied on the first functional layer, advantageously achieves the result that when the sacrificial layer is removed etching of the areas of the first functional layer covered by the protective layer is prevented, and that in the area of the free sections of the first functional layer the sublayer that is next to the conductive area, which conductive area constitutes at least a second course of the first functional layer and is also under the protective layer, is removed from the conductive area of the first functional layer together with the sacrificial layer.

It is advantageous here that a layer of the microsystem, which in Microsystems, in practice, may be already provided on the side of the first functional layer facing the sacrificial layer as a structured etch stop layer in a plasma or sacrificial layer etching process, is available as a protective layer on the first functional layer without an additional deposition process.

When constructing the microsystem using the exemplary method according to the present invention, the layer that acts as a protective layer for the sublayer during the etching of the sacrificial layer and is already present is structured on the first functional layer so that the areas of the first functional layer which must not be etched by the etching agent during etching of the sacrificial layer are covered by the protective layer, other areas of the first functional layer are exposed to an etching attack in the desired manner during etching of the sacrificial layer, and furthermore the property of the protective layer as an etch stop layer continues to be reliably ensured during the process of etching the sacrificial layer.

It is advantageous here that Microsystems manufactured according to the present invention are economically producible, because the non-conductive layer used additionally according to the present invention as a protective layer is in practice likewise already structured, and the structuring of the layer is now carried out according to the present invention in an especially suitable manner with regard to the later etching of the sacrificial layer.

The protective layer provided on areas of the first functional layer prevents etching of the sublayer, which may be constructed with a diffusion barrier, in the areas covered by the protective layer in a simple manner. This is especially advantageous, since etching of the diffusion barrier may under some circumstances result in destruction of the entire system, since the diffusion barrier is located between the mechanical microsystem and the electronics of the microsystem, and when the diffusion barrier is removed under anchors of the microsystem, the microsystem or partial areas thereof are not firmly connected to the electronics. Breaking out of individual structures of the microsystem is in every case equivalent to destruction of the microsystem.

In addition, the exemplary method according to the present invention is also based on the advantage that the conductive area of the first functional layer is executed after the etching of the sacrificial layer by areas without an additional process step without the diffusion barrier, which may be made of very hard materials and on which wire bonding is only performable with great difficulty.

DETAILED DESCRIPTION

Figure 1:
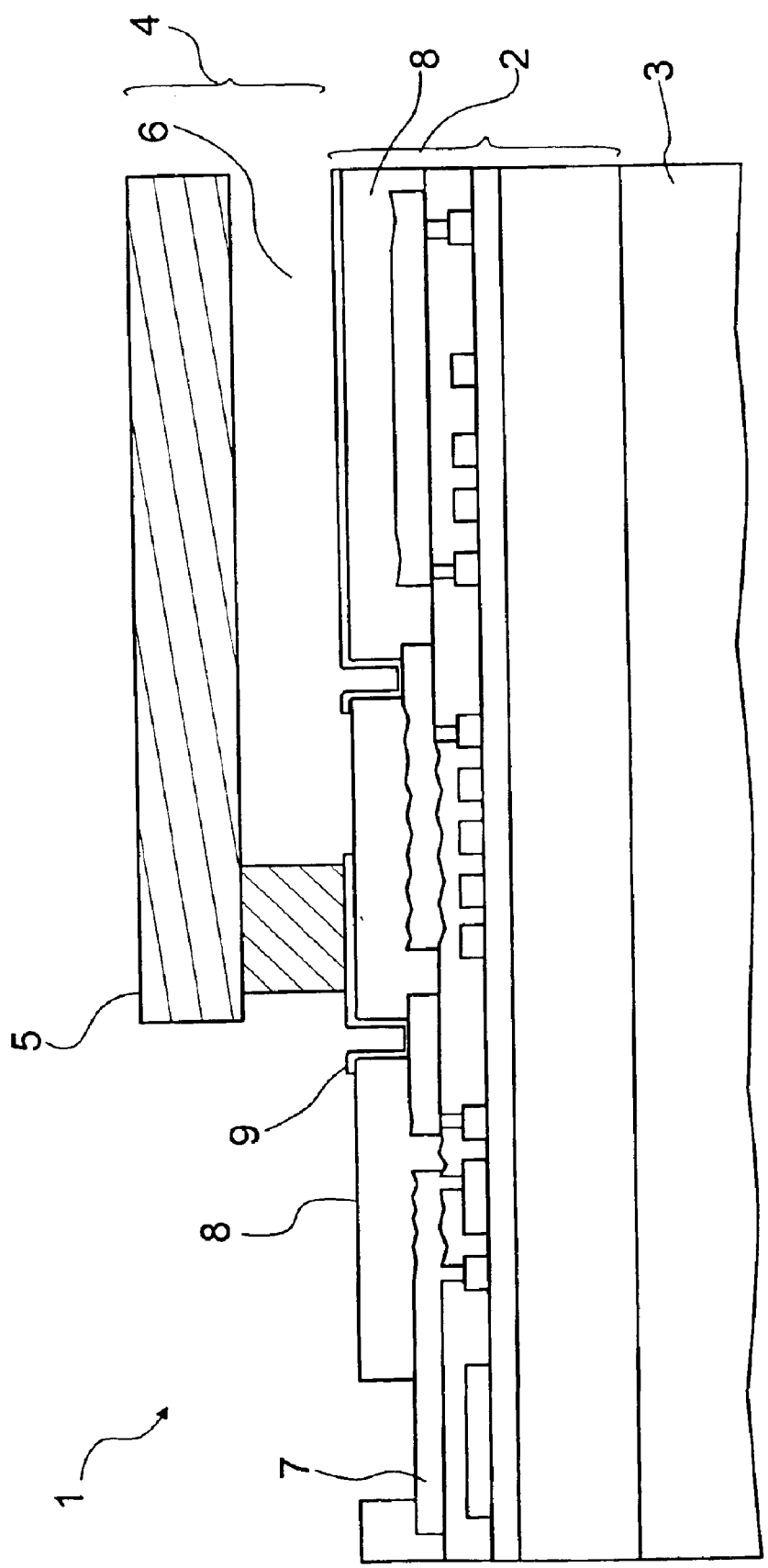
FIG. 1 shows a first exemplary embodiment of an integrated microsystem.
Figure 2:
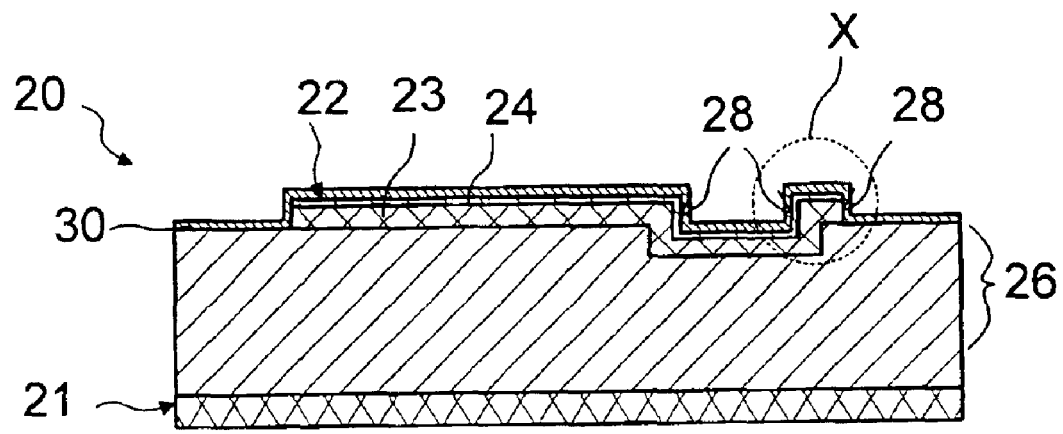
FIG. 2 shows a second exemplary embodiment of a microsystem, having a structured first two-course functional layer sputtered onto a substrate and a protective layer superposed thereon.

Referring to FIG. 1, an integrated microsystem 1 is shown which takes the form of a microelectromechanical system on an integrated circuit device. An electronic circuit 2 is placed on a wafer or substrate 3. A mechanical system 4 is partially formed of a body 5 made of silicon-germanium. Body 5, or its composition, has such a low proportion of germanium that it is not attacked by an etching solution which is intended to remove a sacrificial layer 6 that exists between electronic circuit 2 and body 5 prior to the etching process. The proportion of germanium in body 5 is lower than 80% in the present case, while the proportion of germanium may be lower than 40% in one embodiment of the present invention, and equal to 20% to 30% in another embodiment. With such proportions of germanium, a reaction with the etching solution, which is hydrogen peroxide in the present case, is reliably prevented.

Sacrificial layer 6 is implemented here as a germanium sacrificial layer, and may also have other components up to a certain proportion. Such components may include silicon, with the provision that a proportion of only up to a limiting value of about 20% may be provided, in order not to prevent etching. The proportion of silicon should be sufficiently small so that removal or partial removal of sacrificial layer 6 during the process of etching the sacrificial layer is not negatively influenced by too low a rate of etching sacrificial layer 6, and does not result in the occurrence of silicon residues.

In the manufacturing of microsystem 1, electronic circuit 2 is first created on substrate or wafer 3, which may be in an available manner. That means that a conductor layer of aluminum is first applied and structured on wafer 3. This constitutes the electrical connection between the mechanics and the electronics of microsystem 1. On top of it, sacrificial layer 6 of germanium is deposited and structured. Next, the mechanical functional layer of silicon-germanium, i.e., body 5, is placed on germanium sacrificial layer 6, and is likewise structured.

In addition to the conductors, electronic circuit 2 has passivation layers 8 and silicon-germanium or aluminum layers 9, which are at least partially applied to passivation layers 8.

Layers of silicon-germanium and germanium have the advantage that they have low deposition temperatures, and this allows for the making of back end integration. This means that additional bonding pads or mechanical elements may be added to an integrated circuit device or ready-made IC without influencing or damaging the wafer with the ICs or their function by the additional production steps.

To remove sacrificial layer 6, a sacrificial layer etching procedure is carried out, using a maximum 30% aqueous hydrogen peroxide solution having at least an approximately neutral pH value. To prevent an attack on an open aluminum pad by the etching solution or the acidic etching products that develop during the etching, before the etching process a buffer is added to the etching solution, which keeps the pH value of the etching solution at least approximately neutral during the etching procedure, i.e., at a value of about 7.

That prevents etching of amphoteric metallic conductors or metal pads in a "simple" manner. Alternatively, provision may of course also be made to measure the pH value of the etching solution online by a sensor during the process of etching sacrificial layer 6, and to add the necessary amount of a buffer solution by titration if the pH value of the etching solution drops or rises unacceptably, in order to keep the pH value of the etching solution in a neutral range, i.e., which may be in a pH range between 6 and 8.

The possibility of stabilizing the pH value of the etching solution during the process of etching sacrificial layer 6 by adding the buffer is especially advantageous with a sacrificial layer of germanium or silicon-germanium, since the occurrence of etching products such as $H_2Ge(OH)_6$ or $H_2Si(OH)_6$ acidifies the etching solution in an undesirable manner. Such "acidification" of the etching solution, which would result in an etching attack on the conductors and thus destruction of electronic circuit 2, is prevented by the addition of a suitable buffer.

Especially when using an etching solution of hydrogen peroxide, the buffer employed must be free of alkalis, alkaline earths and metals, since otherwise the hydrogen peroxide would rapidly decompose catalytically into water and oxygen due to the presence of alkaline, alkaline earth or metallic ions. This decomposition may lead to an explosion, especially when sodium acetate or similar alkaline buffers are used. In addition, solutions free of alkalis, alkaline earths and metals must be used when producing semiconductors, since such materials may contaminate production equipment, and thus may lead to failure of the integrated circuits of the microelectromechanical systems produced in that equipment.

As an alternative to hydrogen peroxide, to etch sacrificial layer 6, other suitable oxidizing agents may be used whose pH value is at least approximately neutral, or may be approximately neutralized by adding buffers. When selecting an oxidizing agent to use, the pH value of the oxidizing agent represents a premise that a suitable oxidizing agent is stable at the requisite, at least approximately neutral pH value.

An example of such an oxidizing agent is concentrated nitric acid, since the latter is available in highly concentrated form in a non-dissociated form and has no protons. When concentrated nitric acid is used, for example, an open aluminum pad is passivated, so that no attack occurs on open aluminum layer 7. Also usable are peroxosulfate, peroxodisulfate or chlorate, the latter for example also as an ammonium compound in the form of ammonium chlorate, ammonium chlorite or ammonium hypochlorite, since these substances both etch and also buffer.

If sacrificial layer 6 is of germanium or a silicon-germanium layer having a high proportion of germanium, for example, which may have a proportion of germanium greater than 80%, the sacrificial layer is etched by the concentrated nitric acid, since germanium, in contrast to aluminum, does not form a dense oxide. In any case, there should be assurance that if nitric acid is used it is used in concentrated form, in order to prevent an attack on the free metal conductors of microsystem 1.

The buffer employed may be made up for example of compounds which have cations such as ammonium, tetramethylammonium or tetraethylammonium ions. Corresponding anions that form compounds with the forenamed cations may include chloride, bicarbonate, carbonate, dihydrogenphosphate, hydrogenphosphate, phosphate, acetate, tartrate or nitrate ions. That means that an employed buffer may be a compound of the forenamed cations and anions, such as ammonium acetate, ammonium dihydrogenphosphate or also tetramethyl ammonium dihydrogenphosphate.

The buffer concentrations used and the composition of the etching solution must be matched to the particular application, with control of the etching process in particular significantly dependent on the concentration of the oxidizing agent in the etching solution. In the present case, a 30% aqueous solution of hydrogen peroxide is proposed as the etching solution, buffered with a 1% to 10% concentration of the buffer, if the buffer has one mole of cations or one mole of anions.

Furthermore, use of a forenamed buffer is a simple and advantageous countermeasure to the frequent action of adding acidic components to hydrogen peroxide to stabilize the hydrogen peroxide, because without a buffer, adding the acidic components would result in a shift in the pH value, which in turn would cause etching of open metallic conductors of a microsystem by the etching solution during a sacrificial layer process.

Some of the previously described buffers have advantages, especially when etching germanium sacrificial layers in combination with aluminum as the metallization. For example, especially when ammonium acetate is used as a buffer, chelates or aluminum acetate layers form on open aluminum surfaces of a microsystem, which further passivate the aluminum. Furthermore, when ammonium acetate is used, an increase in the rate of etching the germanium is achieved when etching with hydrogen peroxide.

FIGS. 2 through 5 show various manufacturing stages of a microsystem 20 which is made up of a substrate 21, a first functional layer 22 having a conductive area 23, such as Al, AlSi, AlSiCu or the like, and a sublayer 24 which in the present case constitutes a diffusion barrier and may be made of TiN, and a second functional layer 25, which form a microelectromechanical system having an integrated circuit.

In a departure from the exemplary embodiment represented here, the sublayer of the first functional layer may also be constructed in multiple courses and may, for example, have a bonding layer located between the conductive area and diffusion barrier 24, and/or a contact layer on the side of the diffusion barrier facing away from the conductive area, where the latter-named contact layer improves an electrical contact between diffusion barrier 24 and second functional layer 4 through an available diffusion process.

An integrated circuit or electronic circuit 26, which is depicted in the drawing only in a highly schematized form, is superposed directly on substrate 21. A mechanical system is partially formed by second functional layer 25, made of silicon-germanium in the present case.

Figure 3:
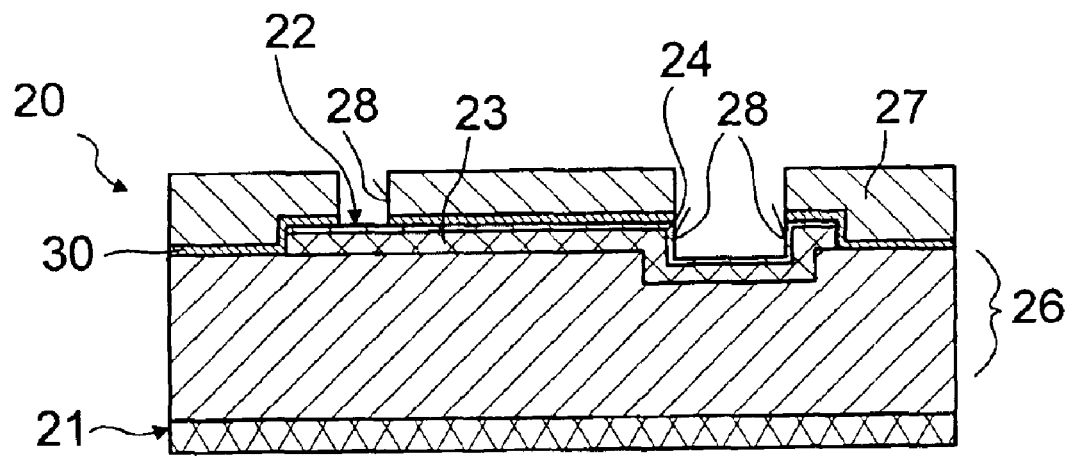
FIG. 3 shows the representation according to FIG. 2, there being a sacrificial layer applied to the first functional layer and to the substrate which is structured in the same manner as the protective layer.

Second functional layer 25 is constructed with such a low proportion of germanium that during etching of a sacrificial layer 27 shown in FIG. 3, which is provided between electronic circuit 26 and second functional layer 25 when constructing microsystem 20, it is not attacked by the etching solution used in etching the sacrificial layer. The proportion of germanium in second functional layer 25 is lower than 80% in the present case, while the proportion of germanium may be lower than 40% in another embodiment of the microsystem and may have a value between 20% and 30% in another embodiment. With such proportions of germanium, reactions between the etching solution, which for a sacrificial layer containing germanium may contain hydrogen peroxide, and second functional layer 25 may be reliably prevented.

Sacrificial layer 27, which is applied using an LPCVD (low pressure chemical vapor deposition) process or some other suitable process, is implemented in the present case as a germanium sacrificial layer and may also have up to a certain proportion of other components. Such components may include silicon, with the provision that a proportion of only up to a limiting value of about 30% may be provided, in order not to prevent etching. The proportion of silicon should be sufficiently small so that removal or partial removal of sacrificial layer 27 during the process of etching the sacrificial layer is not negatively influenced by too low a rate of etching sacrificial layer 27, and does not result in the occurrence of silicon residues.

In the manufacturing of microsystem 20, electronic circuit 26 is first created on substrate or wafer 21 in an available manner. That means that first functional layer 22 with the conductive area 23 and conductive diffusion barrier 24 superposed thereon is first applied and structured on wafer 21. Conductive area 23 is implemented in the present case as an aluminum layer and diffusion barrier 24 as a titanium nitride layer. After first functional layer 22 has been sputtered onto wafer 21, an organic lacquer is applied onto first functional layer 22 and is then exposed, developed and thermally treated. Alternatively, a hard mask is also usable for this purpose instead of a lacquer mask.

Next, first functional layer 22 is structured using a plasma etching process, the plasma structuring may be performed using a Lam Autoetch and $BCl_3$, $Cl_2$ or $CHCl_3$ gas and which may be with a gas volume flow of 50 sccm, 30 sccm or 20 sccm. The plasma structuring is of course also performable using other suitable equipment, gases and gas flows.

The thermal treatment of the organic lacquer applied before structuring first functional layer 22 is carried out at a temperature between 100° C. and 180° C., which may be at a temperature of 165° C., and with a process duration such that edge areas of the lacquer are rounded or at least approximately trapezoidal in cross section after the thermal treatment.

Figure 6:
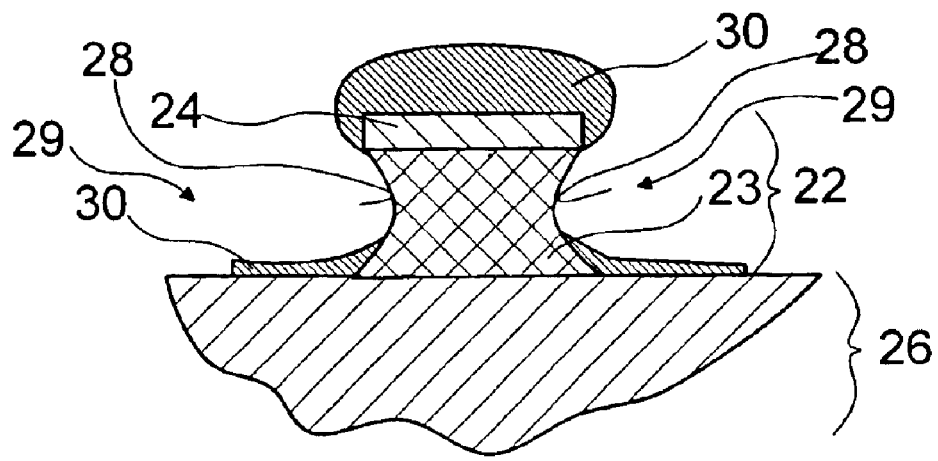
FIG. 6 shows an enlarged individual representation of an area of the microsystem according to FIG. 2 with differences in lateral walls of the first functional layer.

As a result of this, lateral walls 28 of first functional layer 22 are also rounded or at least approximately trapezoidal in cross section after the structuring process. The non-vertical shape of lateral walls 28 of first functional layer 22 is such that an area X from FIG. 2 of microsystem 20 shown enlarged in FIGS. 6 through 8 has a trapezoidal shape in cross section and is free of undercuts 29 shown in FIG. 6, which prevent adequate covering of the edges of functional layer 22 with a protective layer 30. That means that in area X shown in FIG. 6, starting from substrate 21 in the direction of diffusion barrier 24, microsystem 20 has a steadily shrinking layer width of protective layer 30, which allows for an etching attack during wet chemical structuring on titanium nitride layer 24 in the areas of first functional layer 22 not covered by protective layer 30, in other words in the area of undercuts 29.

Figure 7:
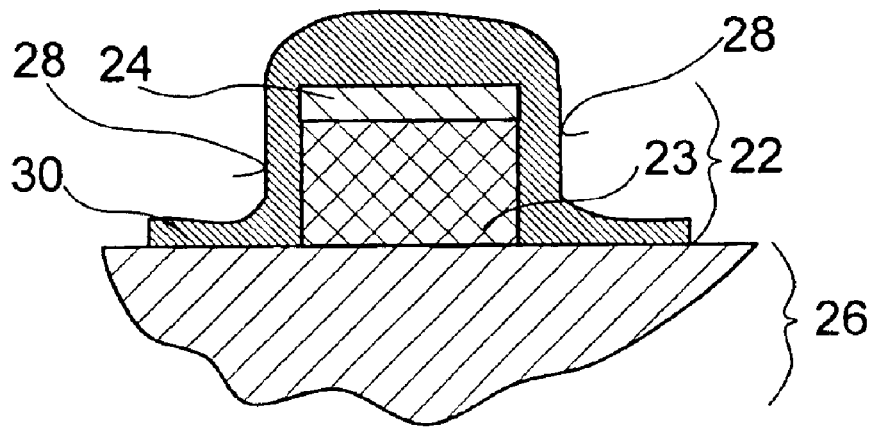
FIG. 7 shows area X, the lateral walls of the first functional layer running essentially perpendicular to the substrate.
Figure 8:
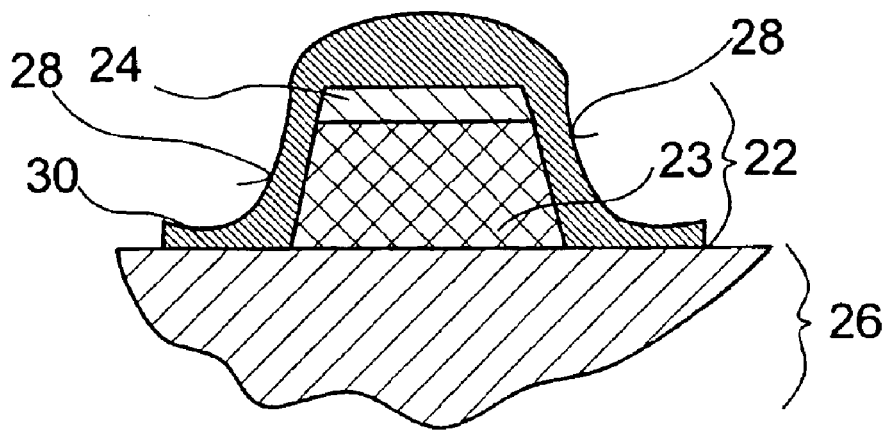
FIG. 8 shows area X, the first functional layer being configured with a cross section having essentially trapezoidal lateral walls.

A lateral wall geometry of structured first functional layer 22 shown in FIGS. 7 and 8 is a prerequisite for conformant covering of first functional layer 22 by protective layer 30, which constitutes an etch stop layer during etching of the sacrificial layer and is electrically insulating, and which constitutes a protection for first functional layer 22 during removal of sacrificial layer 27, since protective layer 30 is not attacked by the etching agent.

Protective layer 30 is applied on structured first functional layer 22, the lacquer coat applied for the structuring of first functional layer 22 being removed again prior to application of protective layer 30.

The lateral wall geometry of first functional layer 22 shown in FIG. 8, having lateral walls 28 of essentially trapezoidal cross section, results in the possibility of a first functional layer 22 having for example a thickness of 700 nm being completely encapsulated in a protective layer 30 which may be in the form of an $SiO_2$ layer, especially a low-temperature oxide layer (LTO layer), having a layer thickness for example of 100 nm. The quality of the encapsulation of first functional layer 22 by protective layer 30 is decisive in the present case in reliably preventing etching of diffusion barrier 24 of first functional layer 22 when removing sacrificial layer 27.

Another exemplary method according to the present invention provides that lateral walls 28 of the microsystem are not rounded during the thermal post-treatment nor do they have a trapezoidal cross sectional shape after the thermal treatment, as shown in FIG. 7, but run essentially perpendicular to the surface of first functional layer 22. So that sufficient coverage of first functional layer 22 in the area of lateral walls 28 is nevertheless achieved, protective layer 30 must have a greater layer thickness than in the case of trapezoidal lateral walls 28 of first functional layer 22; however this prolongs the process time of the deposition process and of the plasma structuring, since longer etching and overetching times are necessary. The uncertainty of the process also increases.

The protective layer, i.e., in the present case LTO layer 30, may be deposited at a furnace temperature of 400° C., a process pressure of 300 mTorr, an oxygen volume flow of 135 sccm and a gas volume flow of 90 sccm of $SiH_4$. Sacrificial layer 27 is then applied onto protective layer 30 and structured. For the structuring, sacrificial layer 27 is first coated with an organic lacquer, which is exposed, developed and then thermally treated, sacrificial layer 27 being structured afterward using a plasma process.

Except for the lacquer layer which is applied for structuring first functional layer 22 and which is rounded by the thermal treatment, the thermal treatment of the lacquer layers applied for structuring the various individual layers of microsystem 20 takes place at a temperature of 90° C. to 130° C., which may be at 120° C., and with a process duration such that the lacquer layers have lateral faces that are essentially perpendicular to the surface of the respective layer under the lacquer layer, and the volatile components are removed from the lacquer layers. As a result of this, in a subsequent structuring process such as a plasma etching procedure, a layer to be structured is produced that likewise has at least approximately perpendicular or vertical lateral faces. Here too, a hard mask is alternatively usable.

After the structuring of sacrificial layer 27, during which protective layer 30 additionally represents a boundary layer for the process of etching sacrificial layer 27, protective layer 30 is removed by areas from first functional layer 22 in a predefined manner, for example using the same lacquer mask as for sacrificial layer 27. Protective layer 30 is removed by areas from first functional layer 22 using a plasma etching process, using $SF_6$ gas or $CHF_3$ gas, in each case thinned in a suitable manner with helium.

However, it is only necessary to open protective layer 30 if protective layer 30 was not removed, or not completely removed, during structuring of sacrificial layer 27 in the areas of first functional layer 22, which are intended as contact surfaces for later electrical attachments or electrical connections.

After the structuring of sacrificial layer 27 and the opening of protective layer 30 which may be additionally necessary in the areas of first functional layer 22 described above, microsystem 20 is at a production stage at which microsystem 20 has open metal areas only in those regions which will be used as anchors, bonding pads or contact pads at a later point in the manufacturing process. At this stage of production, all other areas of microsystem 20 in the present exemplary embodiment are covered both by germanium sacrificial layer 27 and by protective layer 30 in the form of a $SiO_2$ layer. The lacquer mask is removed again after the structuring of sacrificial layer 27 or protective layer 30.

Next, second functional layer 25 is applied to microsystem 20, using an LPCVD procedure or some other suitable procedure. After deposition of second functional layer 25 in the form of a SiGe functional layer, an organic lacquer is applied to the latter and is exposed, developed and thermally treated at a temperature of 90° C. to 130° C., which may be at 120° C., for a process length such that the lateral walls of the lacquer layer run at least approximately vertically or perpendicular to the surface of the lacquer layer, and the volatile portions are removed from the lacquer layer.

Figure 4:
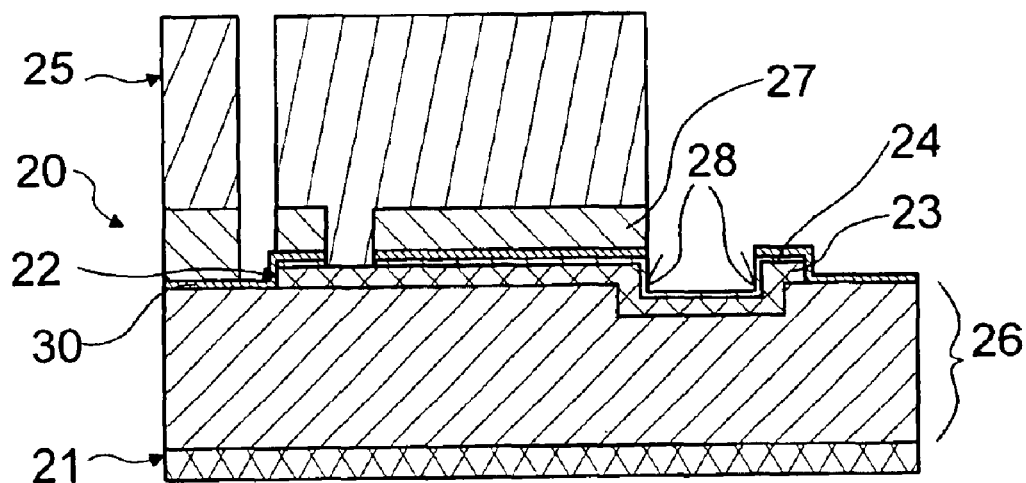
FIG. 4 shows the representation according to FIG. 3, there being a second structured functional layer superposed on the structured sacrificial layer.
Figure 5:
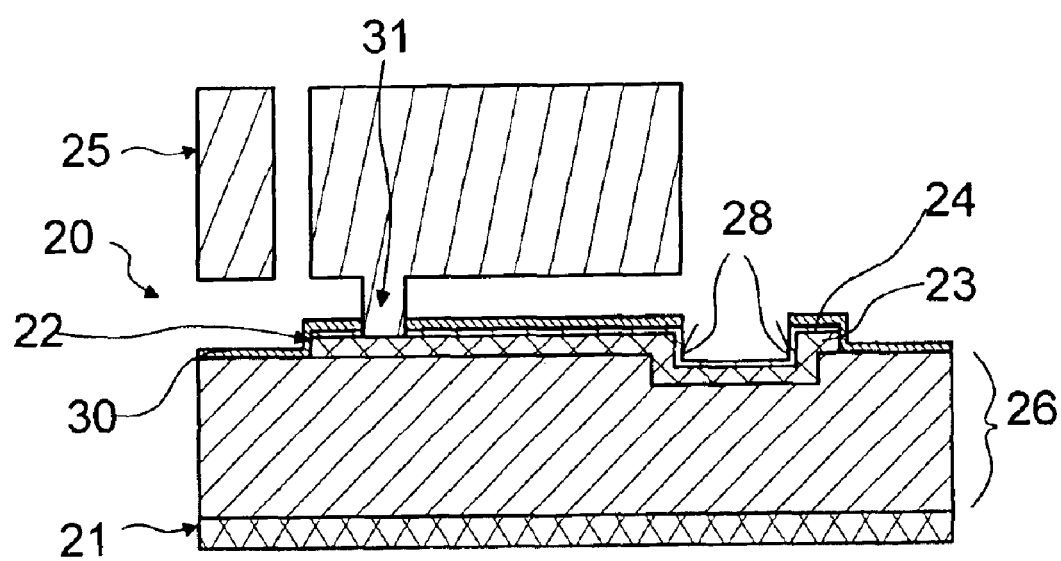
FIG. 5 shows the representation according to FIG. 4 after an etching of the sacrificial layer.

After that, second functional layer 25 is structured using a plasma etching process, so that a microsystem 20 depicted schematically in FIG. 4 exists, in which the bonding pads of microsystem 20 are covered neither by second functional layer 25 and sacrificial layer 27 nor by protective layer 30.

After the structuring of second functional layer 25, sacrificial layer 27 is removed. During the etching of sacrificial layer 27, the etching agent comes into contact with diffusion barrier 24 or with free metal surfaces of first functional layer 22 only in the area of the bonding pads of microsystem 20, since the other areas of first functional layer 22 are covered either by protective layer 30 or by second functional layer 25. The areas of anchors 31 of microsystem 20, which like the bonding pads have no protective layer 30, are covered by second functional layer 25 during etching of the sacrificial layer, and thus are shielded from the etching solution during removal of sacrificial layer 27.

Using the procedural method according to the present invention described above achieves the result that diffusion barrier 24, in the form of a titanium nitride layer, is removed from first functional layer 22 in the area of the bonding pads of microsystem 20, and aluminum layer 23 beneath it is implemented in a subsequent wire bond process without titanium nitride layer 24 which makes this process difficult. In all other areas of microsystem 20, aluminum layer 23 and diffusion barrier 24 are shielded by protective layer 30 against the etching agent used in etching the sacrificial layer, so that conductive area 23 which is important for the functioning of microsystem 20 and diffusion barrier 24 of first functional layer 22 remain intact.

As an alternative to the previously described exemplary embodiment of microsystem 20, the protective layer for first functional layer 22 may be implemented as a silicon carbide layer, and for the sacrificial layer to be made as an LTO or PECVD $SiO_2$ layer, which is etched with hydrofluoric acid to remove it, the general sequence of the exemplary method according to the present invention not being influenced by the choice of material for the protective layer and the sacrificial layer.

The use of hydrogen peroxide may lead in some circumstances to etching of the aluminum layer or of conductive area 23 of the first functional layer and of diffusion barrier 24, which in some cases results even in complete destruction of the bonding pad and of the other free metallic areas of the microsystem before sacrificial layer 27 is completely removed. Such effects are equivalent to destruction of the entire integrated microsystem 20.

In the present case, a maximum 30% aqueous hydrogen peroxide solution having at least an approximately neutral pH value is used to remove sacrificial layer 6 as in the exemplary embodiment of microsystem 1 shown in FIG. 1. To prevent etching of an open aluminum pad of first functional layer 22 by the acidic etching solution or the etching products that develop during the etching, before the etching process a buffer is added to the etching solution, which keeps the pH value of the etching solution at least approximately neutral, i.e., at a value of about 7, or adjusts the pH value to a neutral range during the etching process, since the solution is frequently available commercially only as an acidified solution.

That prevents etching of metallic conductors or metal pads, which may be made of aluminum. Alternatively, provision may also be made to measure the pH value of the etching solution online by a sensor during the process of etching sacrificial layer 27, and to add the necessary amount of a buffer solution by titration if the pH value of the etching solution drops or rises unacceptably, in order to keep the pH value of the etching solution in a neutral range, which may be in a pH range between 6 and 8.

The possibility of stabilizing the pH value of the etching solution during the process of etching sacrificial layer 27 by adding the buffer is especially advantageous—as described in relation to FIG. 1—with a sacrificial layer of germanium or silicon-germanium, since the occurrence of etching products such as $H_2Ge(OH)_6$ or $H_2Si(OH)_6$ acidifies the etching solution in an undesirable manner.

Especially when using an etching solution of hydrogen peroxide, the buffer employed must be at least largely free of alkalis, alkaline earths and metals, since otherwise the hydrogen peroxide would rapidly decompose catalytically into water and oxygen due to the presence of metallic, alkaline or alkaline earth ions. This decomposition may lead to an explosion, especially when sodium acetate or similar alkaline buffers are used.

As an alternative to hydrogen peroxide, to etch sacrificial layer 27, other suitable oxidizing agents may be used whose pH value is at least approximately neutral, or may be approximately neutralized by adding buffers. The oxidizing agent used is selected so that it is stable at the requisite, at least approximately neutral pH value. Another premise when selecting the oxidizing agent is that it etches titanium nitride in the neutral pH range.

An example of such an oxidizing agent is concentrated nitric acid, which is available in highly concentrated form in a non-dissociated form and has no protons. Also, usable are peroxosulfate, peroxodisulfate or chlorate, the latter for example also as an ammonium compound in the form of ammonium chlorate, ammonium chlorite or ammonium hypochlorite, since these substances both etch and also buffer.

If sacrificial layer 27 is of germanium or a silicon-germanium layer having a high proportion of germanium, which may have a proportion of germanium greater than 80%, the sacrificial layer is etched by the concentrated nitric acid, since germanium, in contrast to aluminum, does not form a dense oxide. In any case, there should be assurance here also that if nitric acid is used it is used in concentrated form, in order to prevent an attack on the free metal surfaces on the bonding pads of microsystem 20.

As in the case of the embodiment according to FIG. 1, the buffer employed may be made up for example of compounds which have cations such as ammonium, tetramethylammonium or tetraethylammonium ions. Corresponding anions that form compounds with the forenamed cations may include chloride, bicarbonate, carbonate, dihydrogenphosphate, hydrogenphosphate, phosphate, acetate, tartrate or nitrate ions. That means that an employed buffer may be a compound of the forenamed cations and anions, such as ammonium acetate, ammonium dihydrogenphosphate or also tetramethyl ammonium dihydrogenphosphate.

The buffer concentrations used and the composition of the etching solution must be matched to the particular application, with control of the etching process in particular significantly dependent on the concentration of the oxidizing agent in the etching solution. In the present case, a 30% aqueous solution of hydrogen peroxide is proposed as the etching solution for the embodiment according to FIGS. 2 through 8 as well, buffered with a 1% to 10% concentration of the buffer, if the buffer has one mole of cations or one mole of anions.

What is claimed is:

1. A method for producing an integrated microsystem, the method comprising:

providing at least one silicon-germanium functional layer;

providing at least one germanium sacrificial layer, wherein the at least one germanium sacrificial layer is at least partially removed in an etching solution, and a pH value of the etching solution is stabilized around a pH value of at least approximately 7 by using a buffer; and providing at least one open metal surface.

2. The method of claim 1, wherein the buffer is free of at least one of alkalis, alkaline earths and metals.

3. The method of claim 1, wherein the buffer is selected so that a change in the pH value of the etching solution by etching products, which form during the etching process, is prevented by the buffer.

4. The method of claim 1, wherein the etching solution is made up at least partially of acidified hydrogen peroxide.

5. The method of claim 1, wherein the etching solution contains one of peroxosulfate, peroxodisulfate, a chlorate, a chlorite and a hypochlorite as an oxidizing agent.

6. The method of claim 1, wherein a buffer solution of the buffer contains cations of nitrogen compounds.

7. The method of claim 1, wherein the buffer contains at least one of a bicarbonate, a carbonate, a tartrate and an acetate.

8. The method of claim 1, wherein the buffer contains anions of phosphorus compounds.

9. The method of claim 1, wherein the buffer includes nitrate ions.

10. The method of claim 7, wherein the buffer is made of at least one of ammonium acetate, ammmonium dihydrogenphosphate and tetramethyl ammonium dihydrogenphosphate.

11. The method of claim 6, wherein the buffer solution of the buffer contains at least one of ammonium, tetramethylammonium and tetraethylammonium ions.

12. The method of claim 8, wherein the buffer contains anions of dihydrogenphosphate, hydrogenphosphate or phosphate ions.

* * * * *